US008680927B2

(12) United States Patent
Chatwin

(10) Patent No.: US 8,680,927 B2
(45) Date of Patent: Mar. 25, 2014

(54) SYSTEM AND METHOD FOR EFFECTIVELY IMPLEMENTING A FRONT END FOR A TRANSIMPEDANCE AMPLIFIER

(75) Inventor: Jeremy Chatwin, Santa Cruz, CA (US)

(73) Assignee: Sony Corporation, Tokyo (JP)

( * ) Notice: Subject to any disclaimer, the term of this patent is extended or adjusted under 35 U.S.C. 154(b) by 47 days.

(21) Appl. No.: 13/068,761

(22) Filed: May 19, 2011

(65) Prior Publication Data

US 2012/0249240 A1    Oct. 4, 2012

Related U.S. Application Data

(63) Continuation-in-part of application No. 13/066,412, filed on Apr. 14, 2011, which is a continuation-in-part of application No. 13/065,723, filed on Mar. 29, 2011.

(51) Int. Cl.
*H03F 3/08* (2006.01)
(52) U.S. Cl.
USPC .......................................... 330/308; 330/117
(58) Field of Classification Search
USPC .......................................... 330/308, 117, 301
See application file for complete search history.

(56) References Cited

U.S. PATENT DOCUMENTS

| | | | |
|---|---|---|---|
| 5,892,540 A | 4/1999 | Kozlowski et al. | |
| 6,559,723 B2* | 5/2003 | Hollenbeck et al. | 330/301 |
| 6,720,826 B2 | 4/2004 | Yoon | |
| 7,562,581 B2 | 7/2009 | Garverick et al. | |
| 7,642,858 B2* | 1/2010 | Lee et al. | 330/301 |
| 7,688,146 B2* | 3/2010 | Kao et al. | 330/301 |
| 7,692,493 B1* | 4/2010 | Chen et al. | 330/301 |
| 7,944,310 B2* | 5/2011 | Chiu | 330/301 |
| 8,154,347 B2* | 4/2012 | Chiu et al. | 330/301 |
| 2002/0153949 A1 | 10/2002 | Yoon | |

FOREIGN PATENT DOCUMENTS

GB    2424138 A    9/2006

OTHER PUBLICATIONS

Raut, R., Ghasemi, O., A Power Efficient Wide Band Trans-Impedance Amplifier in Sub-Micron CMOS Integrated Circuit Technology, Dept. of Electr. & Comput. Eng., Concordia Univ., Montereal, QC, http://ieeexplore.ieee.org/Xplore/login.jsp?reload=true &url=http:%3A%2F%2Fieeexplore.ieee. org%2Fiel5%2F4600187%2F4606305%2F04606334. pdf%3Farnumber%3D4606334&authDecision=-203,    Aug.    22, 2008, 1 page.
Kromer, C., Sialm, G., Morf, T., Schmatz, M.L., Ellinger, F., Erni, D., Jackel,H., A Low-POwer 20GHz 52-dB Transimpedance Amplifier in    80-nm    CMOS,    http://ieeexplore.ieee.org/Xplore/login. jsp?url=http%3A%2F%2Fieeexplore.ieee. org%2Fiel5%2F4%2F28938%2F01302265. pdf%3Farnumber%3D1302265&authDecision=-203,    vol.    39 Issue:6, Jun. 1, 2004, 1 page.

* cited by examiner

*Primary Examiner* — Henry Choe
(74) *Attorney, Agent, or Firm* — Gregory J. Koerner; Redwood Patent Law

(57) ABSTRACT

An apparatus for implementing a front end circuit for a transimpedance amplifier includes a front end core that receives an input signal from a photo diode. The front end core responsively generates a balanced output signal to downstream devices. A power supply provides a supply voltage to the front end circuit. In accordance with the present invention, a current source is located between the supply voltage the front end core to thereby isolate the front end core from disturbances on the power supply. This biasing arrangement advantageously provides an improved power supply rejection ratio for the front end circuit.

20 Claims, 13 Drawing Sheets

US 8,680,927 B2

SYSTEM AND METHOD FOR EFFECTIVELY IMPLEMENTING A FRONT END FOR A TRANSIMPEDANCE AMPLIFIER

CROSS-REFERENCE TO RELATED APPLICATIONS

This application is a continuation-in-part of, and claims priority in, U.S. patent application Ser. No. 13/065,723 entitled "System And Method For Effectively Implementing A Unit Gm Cell" that was filed on Mar. 29, 2011. This application is also a continuation-in-part of, and claims priority in, U.S. patent application Ser. No. 13/066,412 entitled "System And Method For Effectively Implementing A Front End Core" that was filed on Apr. 14, 2011. The foregoing related applications are commonly assigned, and are hereby incorporated by reference.

BACKGROUND SECTION

1. Field of the Invention

This invention relates generally to techniques for transferring electronic information, and relates more particularly to a system and method for effectively implementing a front end for a transimpedance amplifier.

2. Description of the Background Art

Implementing effective methods for transferring electronic information is a significant consideration for designers and manufacturers of contemporary electronic systems. However, effectively implementing data transfer systems may create substantial challenges for system designers. For example, enhanced demands for increased system functionality and performance may require additional hardware resources. An increase in hardware requirements may also result in a corresponding detrimental economic impact due to increased production costs and operational inefficiencies.

Furthermore, enhanced system capability to perform various advanced transfer operations may provide additional benefits to a system user, but may also place increased demands on the control and management of various system components. For example, an enhanced electronic system that effectively transfers digital image data may benefit from an effective implementation because of the large amount and complexity of the digital data involved.

Due to growing demands on system resources and substantially increasing data magnitudes, it is apparent that developing new techniques for implementing and utilizing data transfer systems is a matter of concern for related electronic technologies. Therefore, for all the foregoing reasons, developing effective systems for transferring electronic information remains a significant consideration for designers, manufacturers, and users of contemporary electronic systems.

SUMMARY

In accordance with the present invention, a system and method are disclosed for effectively implementing a front end circuit for a transimpedance amplifier. A transimpedance amplifier typically comprises a front end circuit which performs low noise amplification, DC cancellation, and single-ended to balanced conversion. Signal-induced voltage variations at the input to a front end circuit are typically very small. Significant noise injection from the power supply to the front end circuit may swamp the desired input signal and make accurate detection of data difficult or impossible.

In one embodiment, a front end circuit may include a front end core (FE core) that may be implemented in effective manner. The FE core receives an input signal from a photo diode and responsively generates a balanced output signal. The FE core may also include a conventional DC cancellation circuit that may be implemented in any effective manner. In certain embodiments, the DC cancellation circuit is connected from the output to the input of the FE core to attenuate the average DC component of the input signal.

In one embodiment, the front end circuit includes a VDD power supply that is referenced to a VSS reference. The front end circuit further includes a current source that may be implemented in any effective manner. For example, the current source may include, but is not limited to, an NMOS transistor or a PMOS transistor. The current source preferably exhibits a high input impedance and provides a relatively constant output current regardless of changes in the supply voltage VDD. In one embodiment, the current source is connected between VDD and the FE core to thereby isolate the FE core from unwanted disturbances in VDD.

In one embodiment, the front end circuit further includes a capacitor Ccore that is connected across the power terminal and the reference terminal of the FE core. In particular, the capacitor Ccore is connected on a first end to the connection between the current source and the FE core, and on a second end to the connection between VSS and the FE core. Capacitor Ccore may thus decouple the FE core from VSS by providing high-frequency decoupling as a low-pass filter.

In the foregoing embodiment, the front end circuit therefore features a current source device that provides an internally regulated, VSS-referred bias voltage for the FE core to thereby significantly improve the power supply rejection ration (PSRR) of the front end circuit. Any disturbances on VDD are thus advantageously attenuated by the potential divider action of the high impedance of the current source and the low impedance of the FE core. For at least the foregoing reasons, the present invention therefore provides an improved system and method for effectively implementing a front end for a transimpedance amplifier.

DETAILED DESCRIPTION

The present invention relates to an improvement in data transmission systems. The following description is presented to enable one of ordinary skill in the art to make and use the invention, and is provided in the context of a patent application and its requirements. Various modifications to the disclosed embodiments will be readily apparent to those skilled in the art, and the generic principles herein may be applied to other embodiments. Thus, the present invention is not intended to be limited to the embodiments shown, but is to be accorded the widest scope consistent with the principles and features described herein.

The present invention is described herein as an apparatus for implementing a front end for a transimpedance amplifier, and includes a front end core that receives an input signal from a photo diode. The front end core responsively generates a balanced output signal to downstream devices. A power supply provides a supply voltage to the front end circuit. In accordance with the present invention, a current source is provided between the supply voltage the front end core to thereby isolate the front end core from disturbances on the power supply. This biasing arrangement advantageously provides an improved power supply rejection ratio for the front end circuit.

Figure 1:
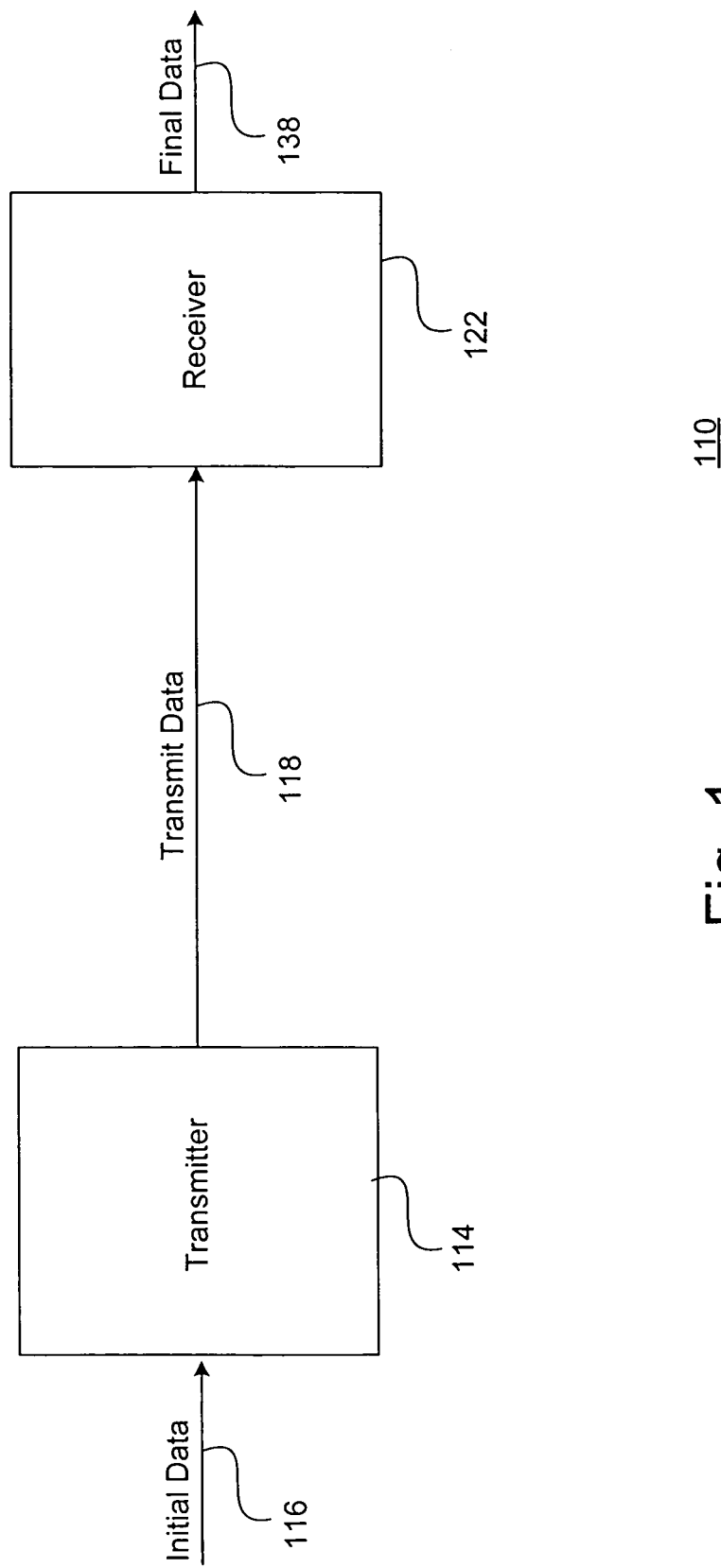
FIG. 1 is a block diagram of a data transmission system, in accordance with one embodiment of the present invention.

Referring now to FIG. 1, a block diagram of a data transmission system 110 is shown, in accordance with one embodiment of the present invention. In the FIG. 1 embodiment, data transmission system 110 includes, but is not limited to, a transmitter 114 and a receiver 122. In alternate embodiments, data transmission system 110 may be implemented using components and configurations in addition to, or instead of, certain of those components and configurations discussed in conjunction with the FIG. 1 embodiment.

In the FIG. 1 embodiment of data transmission system 110, a transmitter 114 receives initial data 116 from any appropriate data source. The transmitter 114 then sends the initial data 116 over any appropriate type of transmission channel as transmit data 118. A receiver 122 of data transmission system 110 may then receive and process the transmit data 118 to thereby provide final data 138 to any appropriate data destination.

Data transmission system 110 may thus transfer any desired type of electronic data or information between two separate locations via a transmission channel. These locations may be considerably distant (for example, between continents or between satellites), or may alternately be relatively close to each other (for example, between devices inside electronic equipment). A wide range of physical transmission media may be used to facilitate this transmission. Examples include electro-magnetic waves in free space (wireless transmission), or electro-magnetic waves in a constrained media (optical fiber, waveguides, cables, etc.).

In the FIG. 1 embodiment, data transmission system 110 thus transfers data from a transmitter (TX) 114 to a receiver (RX) 122 across a channel. In embodiments where data transmission system 110 is implemented as an optical data transmission system, a TX 114 launches a light wave, modulated with data, across a channel. The RX 122 receives the modulated light wave from the other end of the channel and converts the modulation back to data. The channel may be constrained (transmission across an optical fiber) or unconstrained (transmission through free space).

Typically, the TX 114 may include a serializer, a clock synthesizer, a method for adding pre-emphasis, a driver and an electrical to optical transducer. The serializer converts incoming low rate parallel words to high rate serial transmission symbols. The clock synthesizer generates the high rate clock used to transmit the serial transmission symbols. Pre-emphasis may be used to electrically format the serial transmission symbols to pre-compensate anticipated losses in the channel. The driver is used to interface to the electrical to optical transducer. The electrical to optical transducer may include a laser diode or VCSEL device that converts the electrical serial transmission symbols to modulated light. Additional details regarding the implementation and utilization of receiver 122 are further discussed below in conjunction with FIGS. 2-10.

Figure 2:
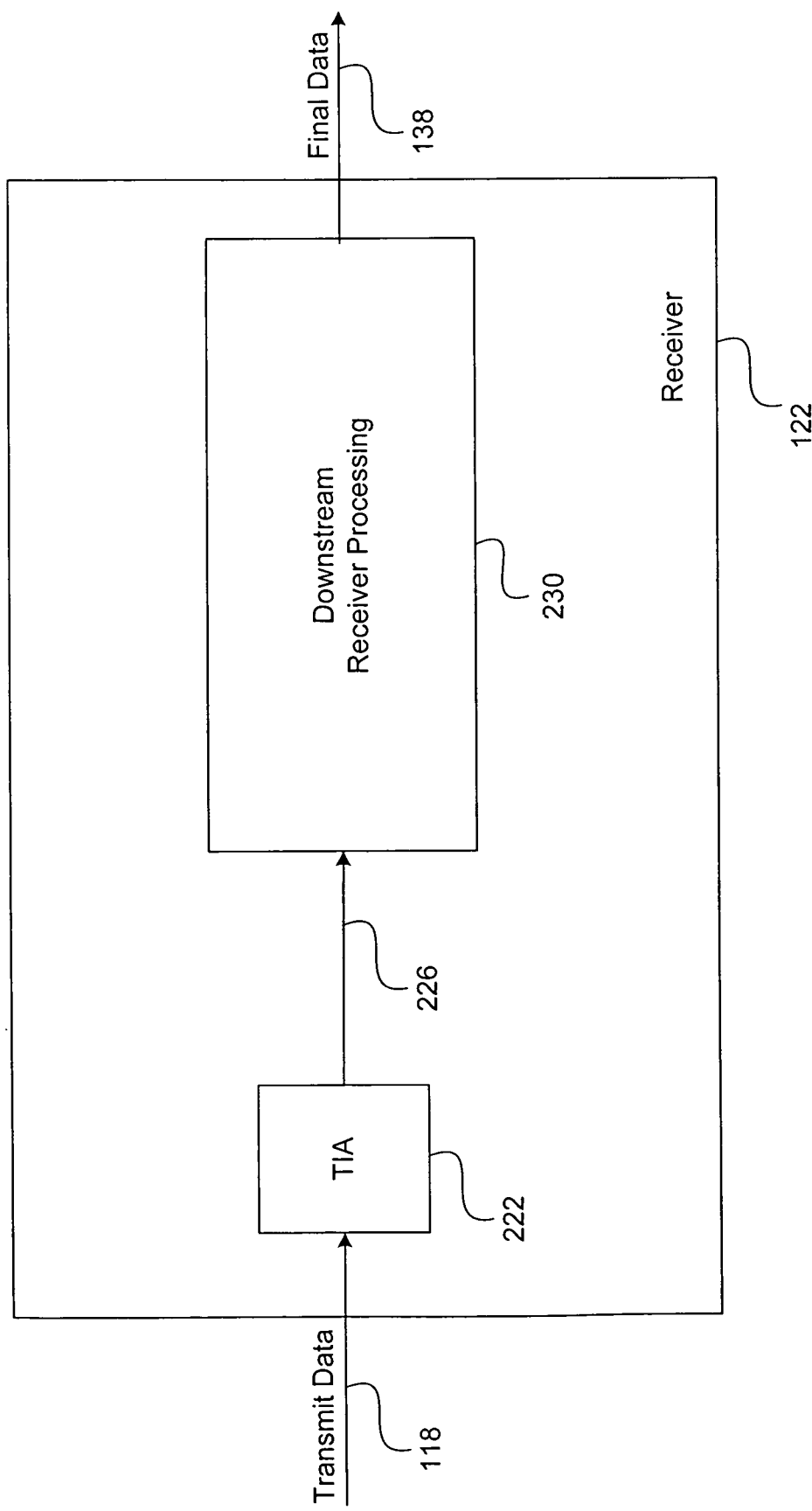
FIG. 2 is a block diagram for one embodiment of the receiver of FIG. 1, in accordance with the present invention.

Referring now to FIG. 2, a block diagram for one embodiment of the FIG. 1 receiver (RX) 122 is shown, in accordance with the present invention. In the FIG. 2 embodiment, receiver 122 may include, but is not limited to, a transimpedance amplifier (TIA) 222 and downstream receiver processing 230. In alternate embodiments, receiver 122 may be implemented using components and configurations in addition to, or instead of, certain of those components and configurations discussed in conjunction with the FIG. 2 embodiment. In various embodiments, receiver 122 may be implemented as any other appropriate type of electronic device.

In the FIG. 2 embodiment, transmit data 118 may be received from any desired data source, and may be encoded in any appropriate data format. For example, in certain embodiments, transmit data 118 may be received from a transmitter 114 of a data transmission system 110 (FIG. 1). In the FIG. 2 embodiment, the RX 122 may typically include an optical to electrical transducer (see FIG. 3), a transimpedance amplifier (TIA) 222, and downstream receiver processing 230 that includes, but is not limited to, a limiting amplifier (LA) or automatic gain control amplifier (AGC), an equalizer (EQ), a clock and data recovery unit (CDR) and a deserializer. The optical to electrical transducer is typical a photo diode (PD) or PIN diode which converts incoming modulated light to a low amplitude electrical signal.

A transimpedance amplifier (TIA) 222 is an integral component in an optical data transmission system. The TIA 222 amplifies the low amplitude electrical signal and produces a differential output voltage. The LA or AGC further amplifies the TIA output to a level suitable for further processing. An EQ may be used to compensate for signal distortions introduced by the channel and/or the transducers. The CDR synchronizes the incoming signal to a local clock and makes decisions as to the most likely transmitted data. The deserializer converts the received high rate serial data to a lower rate parallel word stream. Certain additional details for the implementation and utilization of TIA 222 are further discussed below in conjunction with FIGS. 3-10.

Figure 3:
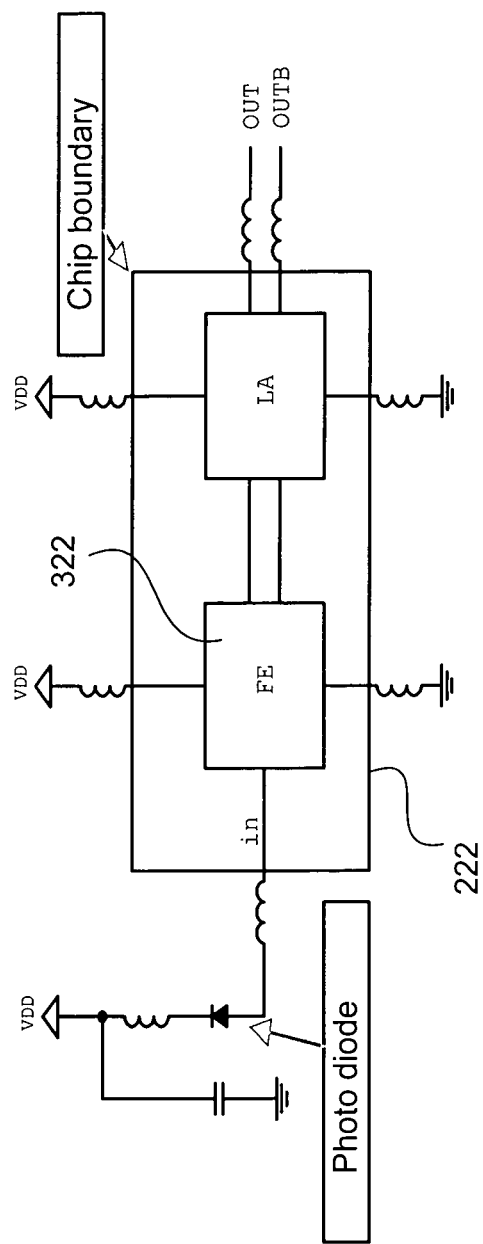
FIG. 3 is a block diagram for the transimpedance amplifier of FIG. 2, in accordance with one embodiment of the present invention.

Referring now to FIG. 3, a block diagram for the FIG. 2 TIA 222 is shown, in accordance with one embodiment of the present invention. The FIG. 3 diagram is presented for purposes of illustration, and in alternate embodiments, TIAs 222 may utilize components and configurations in addition to, or instead of, certain of those components and configurations discussed in conjunction with the FIG. 3 embodiment.

In the FIG. 3 embodiment, an optical to electrical transducer is typically a photo diode (PD) or PIN diode which converts incoming modulated light to a low amplitude electrical signal that is processed by a front end (FE) 322 which amplifies the low amplitude electrical signal and produces a differential output voltage. The LA or AGC further amplifies the FE output to a level suitable for further processing.

In the FIG. 3 embodiment, TIA 222 is typically a single chip comprising front end (FE) 322, which performs low noise amplification, DC cancellation and single ended to balanced conversion, and an additional buffer or amplifier (LA) to drive an output signal off chip. The TIA 222 may also contain additional devices to assist in biasing an optical to electrical transducer and to perform other ancillary tasks. Additional details for the implementation and utilization of front end 322 are further discussed below in conjunction with FIGS. 4-10.

Figure 4A:
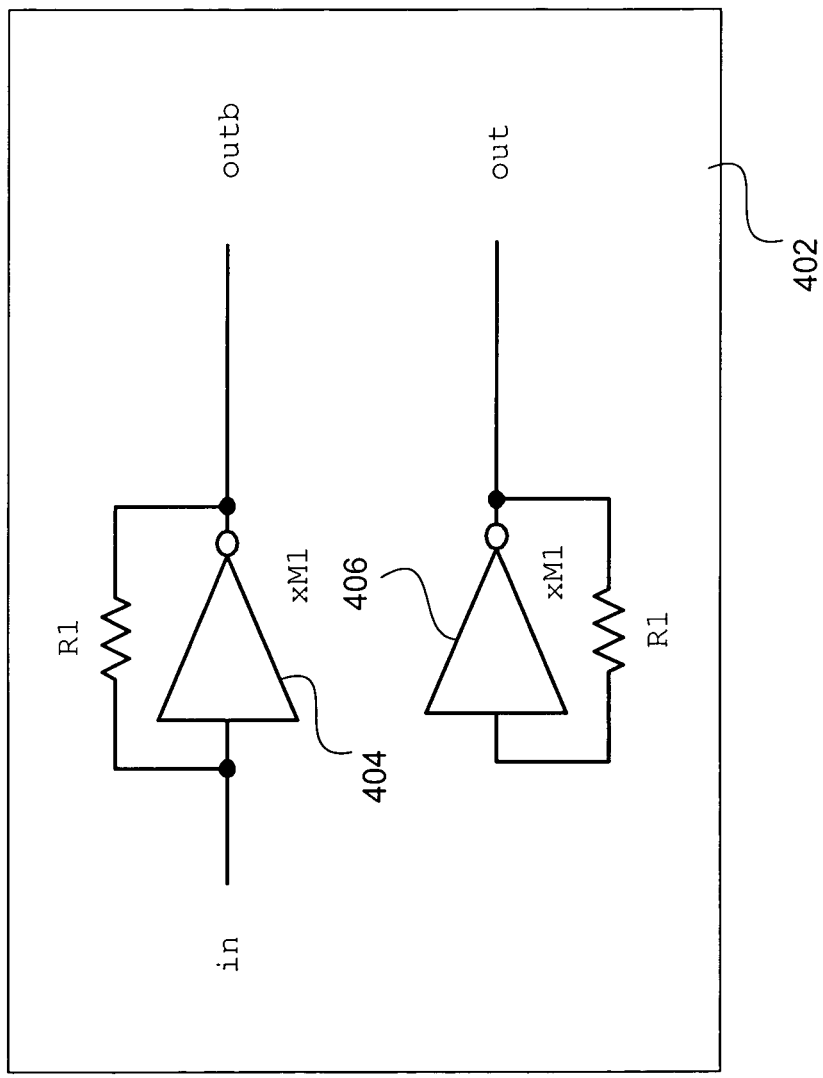
FIG. 4A is a schematic diagram for a first embodiment of a front end core.

Referring now to FIG. 4A, a block diagram for a first embodiment of a front end (FE) core 402 is shown. The FIG. 4A diagram is presented for purposes of illustration, and in alternate embodiments, front end cores 402 may utilize components and configurations in addition to, or instead of, certain of those components and configurations discussed in conjunction with the FIG. 4A embodiment.

In general, FE cores provide broad-band, low-noise signal amplification. Additionally they provide conversion from a single ended input signal to a balanced or differential output signal. Succeeding stages typically require a differential or pseudo-differential input signal. Conventional FE cores typically use one of two general methods to provide this single-ended to balanced conversion. Both methods employ a "dummy" or "replica" of the main input stage.

In the FIG. 4A embodiment, input signal (in) is connected to a single ended amplifier 404 connected between pins "in" and output "outb". A replica 406 of the same type of amplifier, with no connection to its input, is connected to the pin "out". Therefore the "out" voltage approximately tracks the voltage on "outb" over process, supply voltage and temperature (PVT) changes. The output voltage is "pseudo differential" in that "outb" voltage changes in response to changes at "in," whereas the "out" voltage does not change in response to changes at "in".

Other conventional circuits use a truly differential input stage with differential feedback to generate the output reference. In this case both "out" and "outb" voltages change in response to changes at "in". However a replica feedback resistor is still required from "out" to complete the FEcore stage. The utilization of a dummy stage, as discussed in conjunction with the FIG. 4A embodiment, typically utilizes power and also generates a lot of noise which are significant negative aspects of these replica-based embodiments.

Figure 4B:
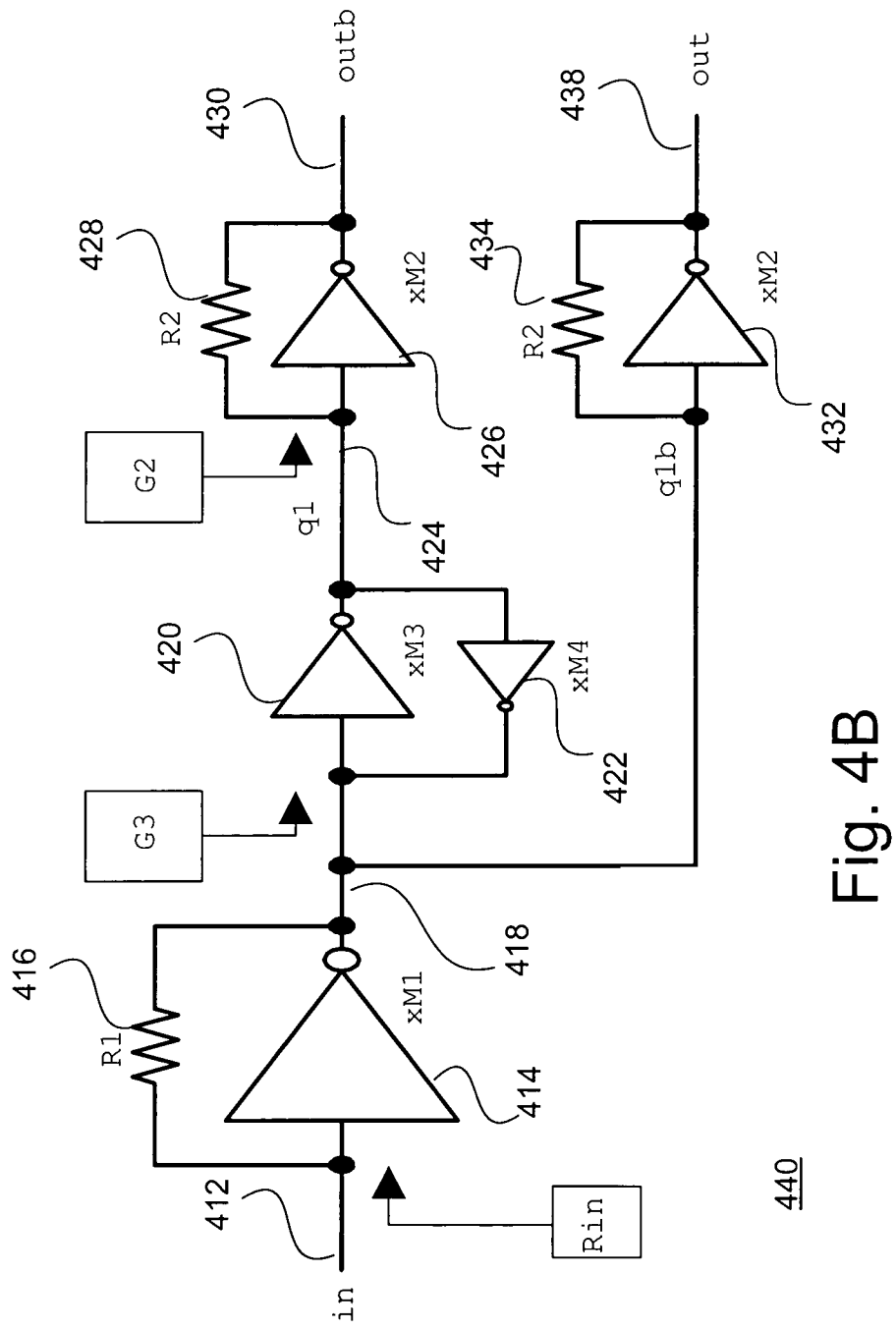
FIG. 4B is a schematic diagram for a second embodiment of a front end core.

Referring now to FIG. 4B a schematic diagram for a second embodiment of a front end (FE) core 440 is shown. The FIG. 4B diagram is presented for purposes of illustration, and in alternate embodiments, front end core 440 may utilize components and configurations in addition to, or instead of, certain of those components and configurations discussed in conjunction with the FIG. 4B embodiment.

In the FIG. 4B embodiment, FE core 440 can be split into three sections: 1). A transimpedance input stage, 2). A phase inverter stage, and 3). A pair of identical voltage gain stages. All stages comprise multiples of a unit Gm cell. The particular multiple defining the number of Gm cells is specified by the parameters M1, M2, M3 and M4 in FIG. 4B. Any effective type of Gm cell may be utilized, including but not limited to, the unit Gm cells disclosed below in conjunction with FIGS. 5A, 5B, and 5C.

In the FIG. 4B embodiment, the transimpedance input stage comprises transimpedance gain stage 414 (xM1) and feedback resistor R1 416 that receive input current and provide an output voltage and some gain. The phase inverter stage comprises inverter gain stage 420 (xM3) and inverter feedback gain stage 422 (xM4) that are connected in a back-to-back configuration to generate an inverted output at unity gain. The pair of identical voltage gain stages comprise gain stage 426 (xM2) with feedback resistor R2 428, and gain stage 432 (xM2) with feedback resistor R2 434.

In the FIG. 4B embodiment, FE core 440 receives an input signal (in) 412 at transimpedance gain stage 414 and responsively generates a transimpedance gain stage output 418 that is provided to both an input of voltage gain stage 432 and to an input of phase inverter gain stage 420. Voltage gain stage 432 responsively generates an FE core output signal (out) 438. Phase inverter gain stage 420 generates an inverted output signal 424 at unity gain that is provided to an input of voltage gain stage 426 which then generates an inverted FE core output signal (outb) 430. In the FIG. 4B embodiment, inverter feedback gain stage 422 lowers the output impedance of transimpedance gain stage 414, and therefore functions as a bandwidth enhancer.

In certain embodiments, the input impedance of the voltage gain stages load the input transimpedance stage and the phase inverter stage while the input impedance of the phase inverter stage also loads the input transimpedance stage. Therefore to achieve the desired stage characteristics a particular design method may be utilized to effectively size the Gm cell components in the various gain stages. For purposes of illustration, a series of generalized design steps for designing component values for FE core 440 are shown below. However, other steps, sequences, and techniques may alternately be utilized.

One embodiment of the foregoing design method may include the following steps:

1. Choose initial values for stages 426 and 432 (M2) and stage 420 (M3). In general the voltage gain stage requires a voltage gain>1 to minimize its noise contribution. Typically M2>M3.

2. Compute the value of R2 428 and 434 that achieves the required phase inverter gain, A3=−1.0:

$$R_2 = \frac{-A_3}{M_3 G_{ds}} \frac{(G_m + G_{ds})}{(G_m + A_3 G_{ds})} - \frac{1}{M_2 G_{ds}}$$

3. Compute input conductance, G2 (shown in FIG. 4B), and voltage gain, A2, for the voltage gain stages:

$$G_2 = \frac{M_2(G_m + G_{ds})}{1 + M_2 G_{ds} R_2}$$

$$A_2 = \frac{1 - M_2 G_m R_2}{1 + M_2 G_{ds} R_2}$$

4. Choose an initial value for gain stage 422 (M4). This gain stage provides positive feedback to the load of the input stage and so helps to extend bandwidth of the input stage.

5. Compute input conductance, G3 (shown in FIG. 4B), of the phase inverter stage:

$$G_3 = M_4 G_m \left[ \frac{G_{ds}}{G_m} - \frac{M_3 G_m}{G_2 + M_3 G_{ds}} \right]$$

6). Choose an initial value of gain stage 414 (M1).

7. Compute the required R1 416 that achieves the desired input resistance, Rin (shown in FIG. 4B):

$$R_1 = \frac{R_{in}[M_1(G_m + G_{ds}) + G_2 + G_3] - 1}{M_1 G_{ds} + G_2 + G_3}$$

8. Simulate to determine noise and bandwidth.
9. Iterate values of M1, M2, M3 and M4 until desired performance is achieved.

The total power consumption is proportional to the total number of unit Gm cells, Mtotal, such that:

$$M_{total}=M_1+M_2+M_4+2M_2$$

Therefore, a set of FEcore designs can be derived that exhibit a fixed total power budget, Mtotal, and required input impedance, Rin.

The FIG. 4B transimpedance input stage provides low noise signal amplification, similar to conventional FE cores, but has no replica. The power used for the replica in FIG. 4A may now be employed in the remaining two stages of FIG. 4B. The phase inverter stage provides voltage gain of −1V/V from "q1b" to "q1" of FIG. 4B. Therefore a balanced signal, with both sides responsive to changes at "in" exists at "q1" and "q1b". The voltage gain stages provide simple voltage gain and buffering to drive the succeeding stages.

The FE core 440 of FIG. 4B achieves single-ended to balanced conversion without the use of a replica circuit shown in FIG. 4A, and produces a truly balanced output signal for the succeeding stages. The absence of a replica stage provides an FEcore that consumes the same power and has the same bandwidth of conventional architectures while achieving a lower input referred noise density.

Figure 5A:
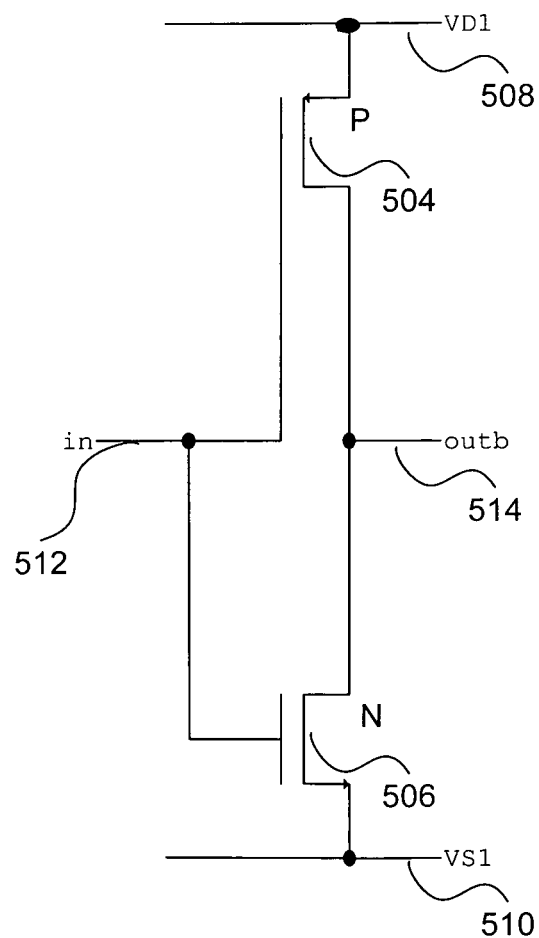
FIG. 5A is a schematic diagram for a first embodiment of a unit Gm cell.
Figure 5B:
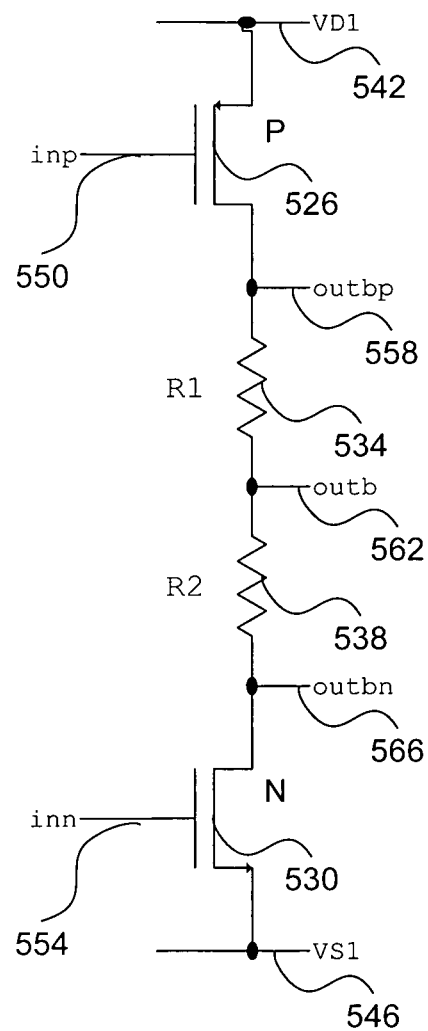
FIG. 5B is a schematic diagram for a second embodiment of a unit Gm cell.
Figure 5C:
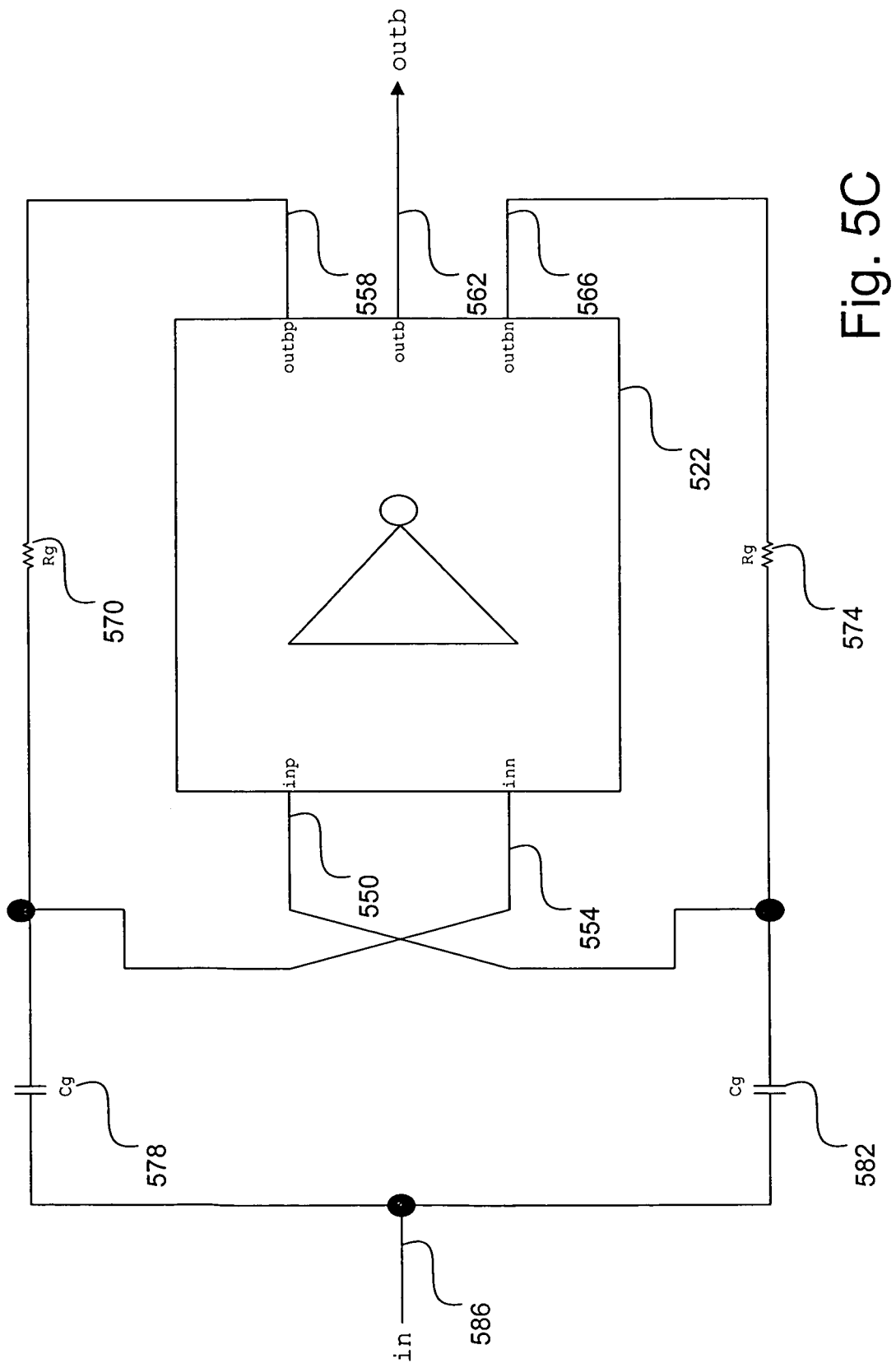
FIG. 5C is a schematic diagram illustrating an electronic circuit for biasing the unit Gm cell of FIG. 5B.

Referring now to FIGS. 5A, 5B, and 5C, schematic diagrams for implementing and biasing of a unit Gm cell are shown. In alternate embodiments, unit Gm cells may be implemented using components and configurations in addition to, or instead of, certain of those components and configurations discussed in conjunction with the FIG. 5 embodiments.

In the FIG. 5A embodiment, a conventional unit Gm cell 502 based on a simple CMOS inverter is shown. A fixed supply voltage, Vcore (VD1 508), biases the cell 502 and a voltage VS1 510 is typically at ground potential. In typical configurations, a feedback resistor (not shown) is connected from output signal outb 514 to input signal in 512 to effect an FE input stage for TIA 222 (FIG. 2). Therefore, the gate and drain voltages are at substantially the same potential and so the PMOS and NMOS transistors (transistor P 504 and transistor N 506) form a potential divider and both share the same drain current.

Furthermore, typical voltage amplitudes at the gate and drain are in the tens of mV range. Therefore drain voltage excursions have a wide margin of drain-source voltage, VDS, before the onset of triode mode. This wide margin is due to the "stacking" nature of the NMOS and PMOS Vgs. In other words, for the FIG. 5A Gm cell 502, the supply voltage, Vcore (here VD1 508), may be expressed by the formula:

$$Vcore=-Vgs,P+Vgs,N$$

where −Vgs,P is the voltage across transistor P 504 and Vgs,N is the voltage across transistor N 506. The supply voltage for the FIG. 5A embodiment is therefore the sum of the voltages across transistor P 504 and transistor N 506.

In the FIG. 5B embodiment, Gm cell 522 includes an upper-rail supply voltage (VD1 542) which provides a Vcore supply voltage to power Gm cell 522. Gm cell 522 also includes a lower-rail voltage VS1 546 that is typically at or near a ground potential of zero volts. In the FIG. 5B embodiment, the gate of a P-channel transistor P 526 receives an input signal inp 550. The source of transistor P 526 is connected to supply voltage VD1 542, and the drain of transistor P 526 is connected to a first end of a first level-shifting resistor R1 534. An output signal outbp 558 is generated at the junction of the drain of transistor P 526 and the first end of level-shifting resistor R1 534.

In the FIG. 5B embodiment, the gate of an N-channel transistor N 530 receives an input signal inn 554. The source of transistor N 530 is connected to voltage VS1 546, and the drain of transistor N 530 is connected to a second end of a second level-shifting resistor R2 538. An output signal outbn 566 is generated at the junction of the drain of transistor N 530 and the second end of level-shifting resistor R2 538. In the FIG. 5B embodiment, a second end of level-shifting resistor R1 534 is connected to a first end of level-shifting resistor R2 538. A main output signal outb 562 is generated at the junction of the second end of level-shifting resistor R1 534 and the first end of level-shifting resistor R2 538.

In the FIG. 5C embodiment, a biasing circuit is shown for effectively implementing the unit Gm cell 522 of FIG. 5B. In the FIG. 5C embodiment, many of the numbered components refer back to similarly-numbered components shown in FIG. 5B. In the FIG. 5C embodiment, a main input signal 586 is provided through a first coupling capacitor Cg 578 to an input inn 554 of the Gm cell 522. Similarly, the main input signal 586 is provided through a second coupling capacitor Cg 582 to the input inp 550 of the Gm cell 522.

In the FIG. 5C embodiment, the output outbp 558 of Gm cell 522 is returned as a bias voltage through a first bias resistor Rg 570 to the input inn 554 of Gm cell 522. Similarly, the output outbn 566 of Gm cell 522 is returned as a bias voltage through a second bias resistor Rg 574 to the input inp 550 of Gm cell 522. In accordance with the present invention, the biasing configuration shown in FIG. 5C for Gm cell 522 advantageously reduces the required Vcore (VD1 542 of FIG. 5B) for a given Icore, and hence a given Gm, by adding level-shifting resistor R1 534 and level-shifting resistor R2 538 (FIG. 5B). This significant reduction in the required supply voltage VD1 542 provides substantial conservation of power resources for any electronic device that employs unit Gm cell 522.

In the FIGS. 5B and 5C embodiments, the input gates ("inn" and "inp") of NMOS transistor 530 and PMOS transistor 526 are connected to the drains ("outbp" and "outbn") of NMOS transistor 530 and PMOS transistor 526, respectively, through the large bias resistors Rg (570 and 574) that carry zero DC current. Signal current is coupled by the AC coupling capacitors Cg (578 and 582). In certain embodiments, exemplary component values may approximately be: Icore=440 uA, R1=R2=250 ohm, Rg=1 Mohm, Cg=1.6 pF.

Thus, when biased with a constant current of Icore, both the NMOS and PMOS devices will have the same Vgs and same Gm as in the unit Gm cell 422 shown in FIG. 5A. However the required supply voltage headroom, Vcore, is given by the equation:

$$Vcore=-Vgs,P-Icore\times(R1+R2)+Vgs,N$$

where −Vgs,P is the voltage across transistor P 526, Vgs,N is the voltage across transistor N 530, and Icore×(R1+R2) is the voltage across level-shifting resistors 534 and 538.

Therefore, provided that the voltage drop Icore×(R1+R2) does not cause the transistors to enter triode mode, the same effective Gm is achieved but with a lower required voltage supply headroom, Vcore. To support a given constant Gm over process and temperature, the unit Gm cell 522 of FIGS. 5B and 5C thus requires less nominal supply voltage and so less power.

Figure 6:
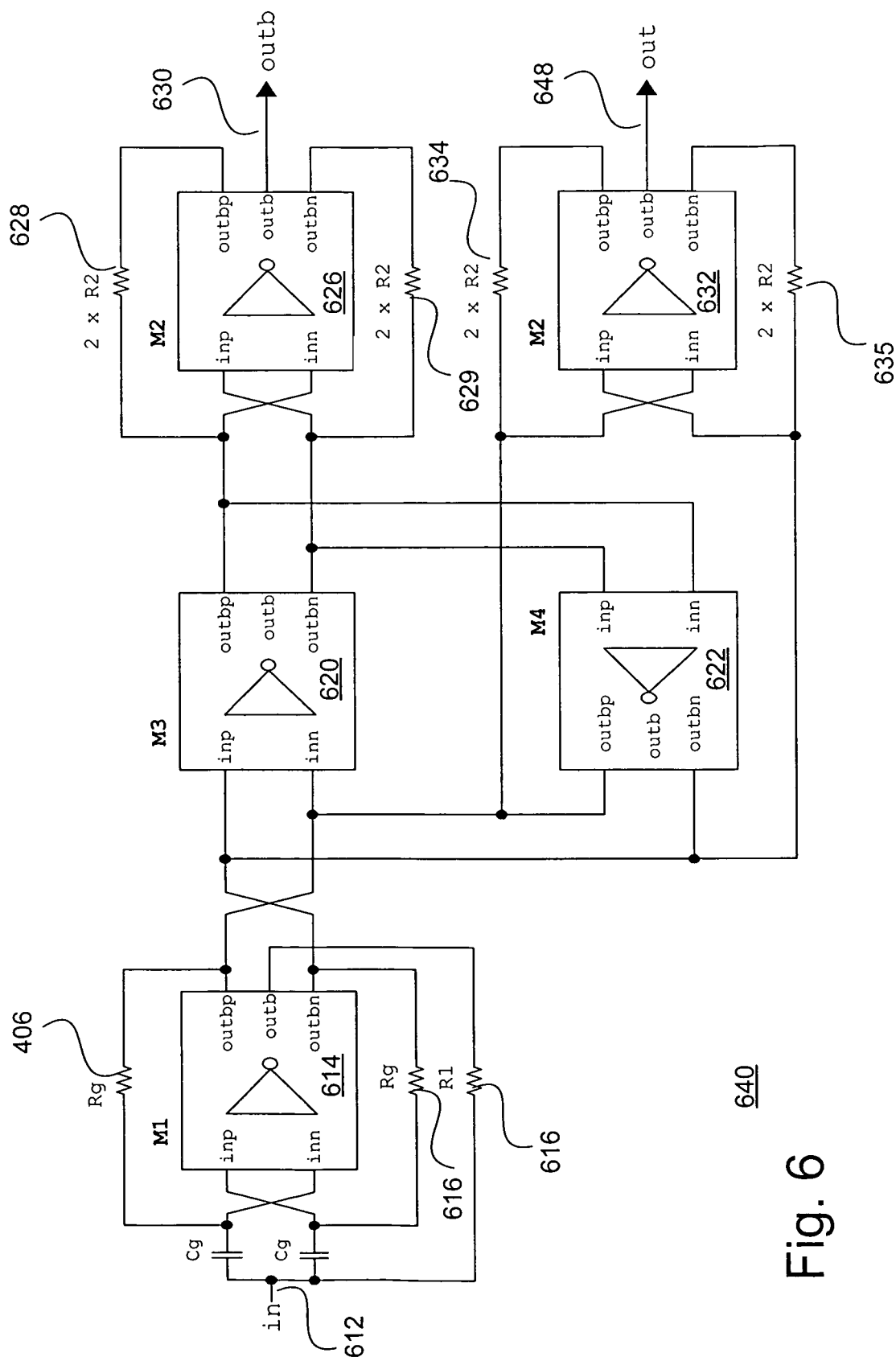
FIG. 6 is a schematic diagram for a second embodiment of a front end core.

Referring now to FIG. 6, a schematic diagram for a third embodiment of an FE core 640 is shown. In alternate embodiments, FE core 640 may be implemented using components and configurations in addition to, or instead of, certain of those components and configurations discussed in conjunction with the FIG. 6 embodiment.

In the FIG. 6 embodiment, certain components and signals correspond to analogous components and signals from the FE core 440 of FIG. 4B. For example, in the FIG. 6 embodiment (as in FIG. 4B), FE core 640 can be split into three stages: 1). A transimpedance input stage, 2). A phase inverter stage, and 3). A pair of identical voltage gain stages. All stages comprise multiples of a unit Gm cell. The particular multiple defining the number of Gm cells is specified by the parameters M1, M2, M3 and M4 in FIG. 6. Any effective type of Gm cell may be utilized, including but not limited to, the unit Gm cell disclosed above in conjunction with FIG. 5C.

In the FIG. 6 embodiment, the transimpedance input stage comprises transimpedance gain stage 614 (M1) and feedback resistor R1 616 that receive input current and provide an output voltage and some gain. The phase inverter stage comprises inverter gain stage 620 (M3) and inverter feedback gain stage 622 (M4) that are connected in a back-to-back configuration to generate an inverted output at unity gain. The pair of identical voltage gain stages comprise output gain stage 626 (M2) with feedback resistors R2 628, 629, and output gain stage 632 (M2) with feedback resistors R2 634, 635.

The FE cores of FIGS. 6 and 4B therefore have at least the following similarities: Transimpedance gain stage 614 is analogous to transimpedance gain stage 414, inverter gain stage 620 is analogous to inverter gain stage 420, inverter feedback gain stage 622 is analogous to inverter feedback gain stage 422, output gain stage 626 is analogous to output gain stage 426, and output gain stage 632 is analogous to output gain stage 432. The foregoing discussion of the FIG. 4B FE core 440 is therefore incorporated herein by reference.

However, the FIG. 4B embodiment of FE core 440 may be implemented using unit Gm cells that have a single input "in" and a single output "outb". In the FIG. 6 embodiment, a similar FE core topology, with some modification, may be implemented using the FIG. 5B unit Gm cell and bias circuitry. In the FIG. 6 embodiment, each gain stage has a "p" input and output, and an "n" input and output. For correct biasing, the "p" outputs should connect to "n" inputs and vice versa (as shown in FIG. 5C). In this way, the AC coupling capacitors, Cg, and large value resistors, Rg, are avoided for the gain stages except the input gain stage 614 (M1).

The FIG. 6 embodiment of FE core 640 feeds DC bias voltages from the outputs of gain stage 614 to effectively bias the inputs of all the other gain stages. The level-shifting discussed above in conjunction with the FIG. 5B unit Gm cell is achieved by the initial gain stage 614, so that no further level-shifting is required by the remaining gain stages in FE core 640.

Figure 7:
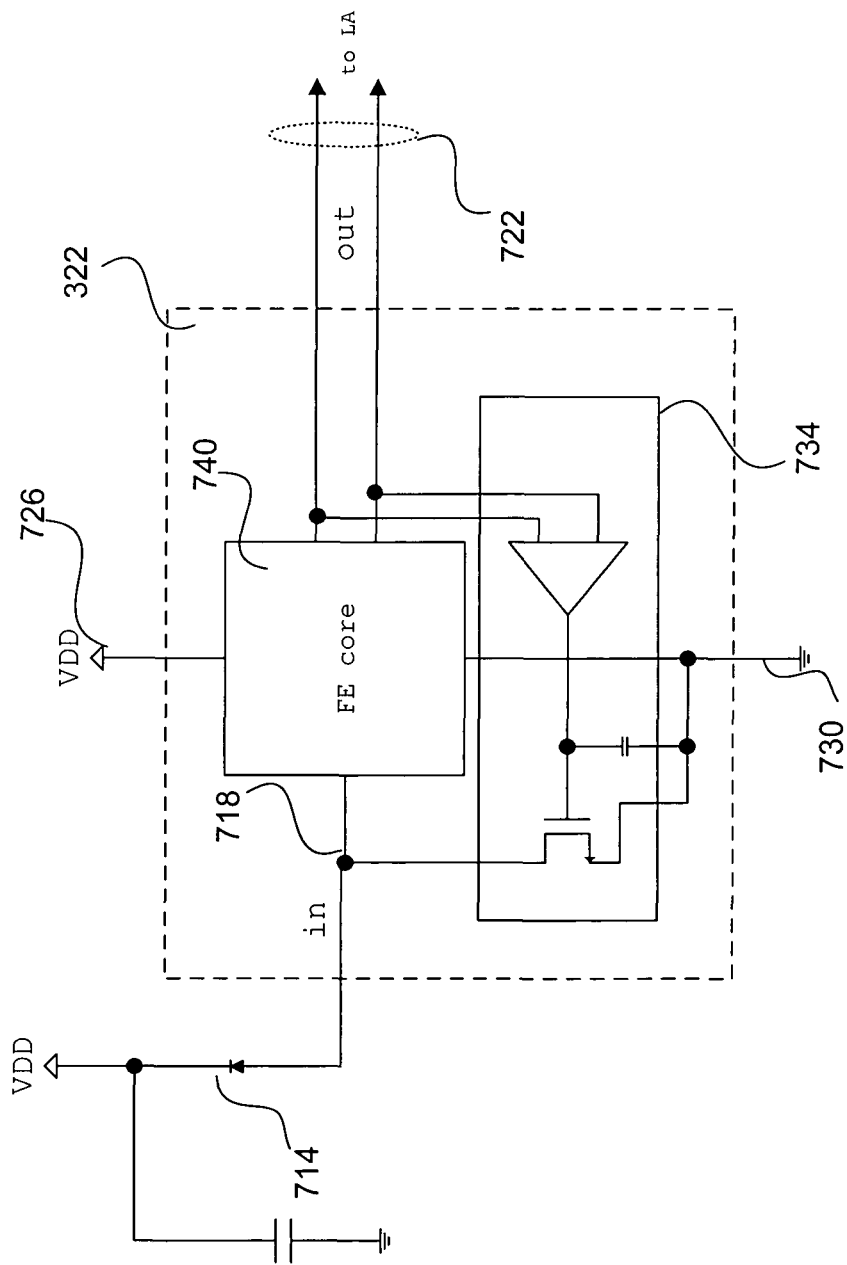
FIG. 7 is a schematic diagram for a conventional embodiment of a front end circuit.

Referring now to FIG. 7, a schematic diagram for a conventional embodiment of a front end circuit 322 is shown. The FIG. 7 diagram is presented for purposes of illustration, and in alternate embodiments, front ends 322 may utilize components and configurations in addition to, or instead of, certain of those components and configurations discussed in conjunction with the FIG. 7 embodiment.

A transimpedance amplifier (TIA) 222 (see FIG. 2) is typically a single chip comprising a front end (FE) 322, which performs low noise amplification, DC cancellation, and single-ended to balanced conversion, and an additional buffer or amplifier (LA) to drive an output signal off chip. Signal-induced voltage variations at the "in" pin 718 are typically very small (on the order of 1 mVpp) and so are easily swamped by voltage noise injected from elsewhere in the chip. An additional problem may exist in terms of the chip substrate connection which is typically connected to one of the power supply pins. All devices on the chip have some parasitic and unavoidable connection to the substrate.

Therefore any chip-generated noise that is injected into the substrate will also be injected out of the substrate elsewhere and into the sensitive input of the FE 322. In many cases this substrate noise will swamp the input signal 718 and reduce the signal to noise ratio. In a multi-channel application the noise injection problem is multiplied by the number of channels thereby rendering this kind of connection unsuitable for low level input signals. A front end 322 should therefore exhibit good power supply rejection. In certain embodiments, low input currents of approximately 25 uApp and low input impedances of approximately 50 ohm imply an input voltage signal of approximately 1.25 mVpp. Significant noise injection from the power supply to the input 718 will swamp the desired input signal and make accurate detection of data impossible. A front end 322 should also exhibit good stability over manufacturing process, power supply and temperature variations.

In the FIG. 7 embodiment, FE 322 includes a front end core (FE core) 740 that may be implemented in any effective manner including, but not limited to, the embodiments disclosed above in conjunction with FIGS. 4A, 4B, and 6. The FE core 740 receives an input signal 718 from a photo diode 714 and generates a balanced output signal 722. The FIG. 7 embodiment also includes a conventional DC cancellation circuit 734 that may be implemented in any effective manner. In the FIG. 7 embodiment, DC cancellation circuit 734 is connected from the output 722 to the input 718 of FE core 740.

In the FIG. 7 embodiment, FE core 740 is directly powered by a VDD power supply 726 that is referenced to a VSS reference 730. The input current from the photo diode (PD) 714, is typically unipolar and exhibits a DC offset, Iave. This current is applied to the FE core 740 where low noise amplification and single-ended to balanced conversion is achieved. FE 322 also provides a bias current to the FEcore 740, derived from the supply voltage. In this case, the nature of bias determines the power supply rejection properties of the overall TIA 222. The FIG. 7 embodiment shows FE core 740 being biased directly from the power supply VDD 726. Therefore, the power supply rejection ratio (PSRR) of this FIG. 7 configuration is poor and performance suffers as a result. Details for the implementation and utilization of a front end 322 with an improved PSRR are further discussed below in conjunction with FIGS. 8-10.

Figure 8:
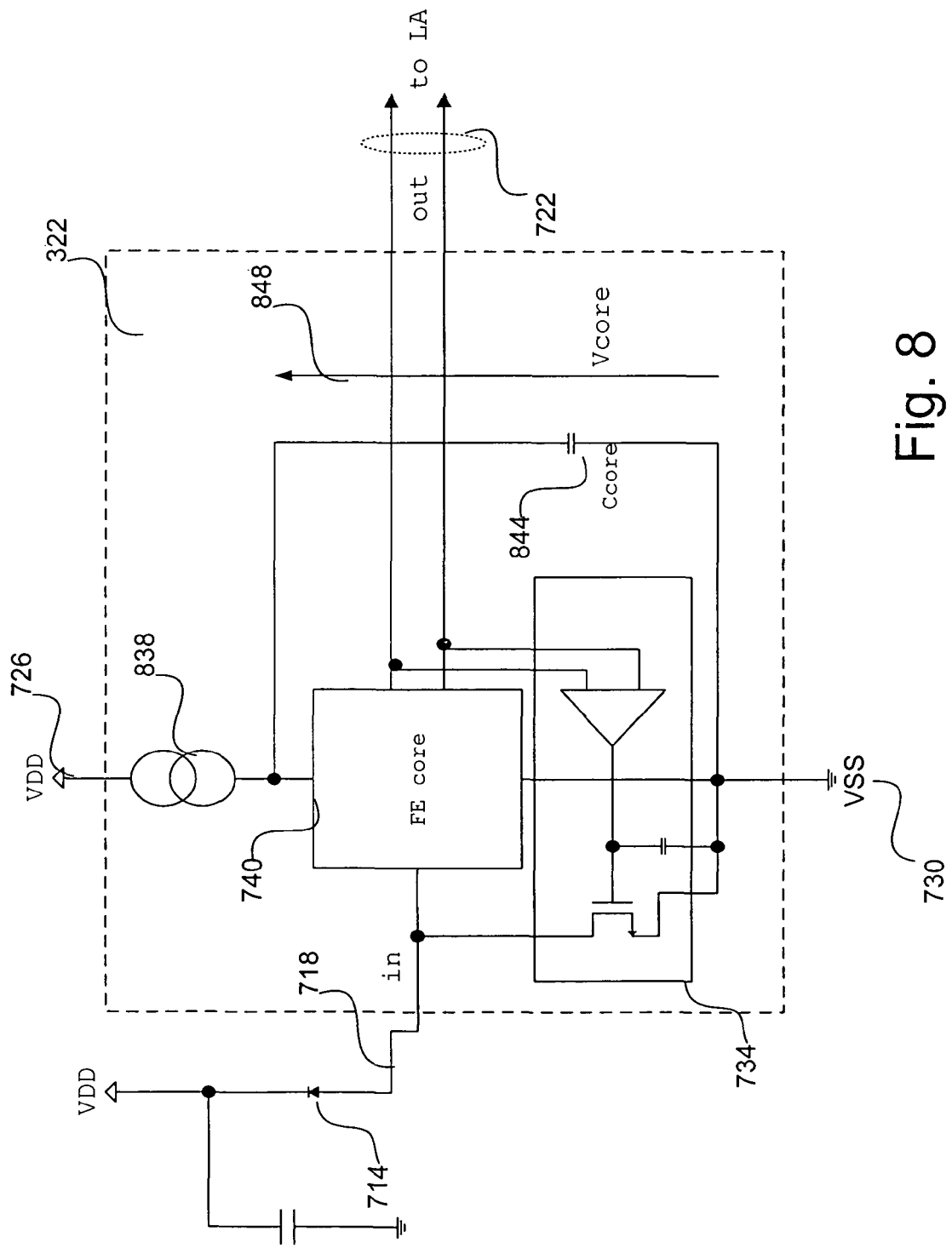
FIG. 8 is a schematic diagram for a first embodiment of a front end, in accordance with the present invention.

Referring now to FIG. 8, a schematic diagram for a first embodiment of a front end 322 is shown, in accordance with the present invention. The FIG. 8 diagram is presented for purposes of illustration, and in alternate embodiments, front end 322 may utilize components and configurations in addition to, or instead of, certain of those components and configurations discussed in conjunction with the FIG. 8 embodiment.

In the FIG. 8 embodiment, FE 322 includes a front end core (FE core) 740 that may be implemented in any effective manner including, but not limited to, the embodiments disclosed above in conjunction with FIGS. 4A, 4B, and 6. The FE core 740 receives an input signal 718 from a photo diode 714 and generates a balanced output signal 722. The FIG. 8 embodiment also includes a conventional DC cancellation circuit 734 that may be implemented in any effective manner. In the FIG. 8 embodiment, DC cancellation circuit 734 is connected from the output 722 to the input 718 of FE core 740 to attenuate the average DC component of input signal 718.

In the FIG. 8 embodiment, FE 322 includes a VDD power supply 726 that is referenced to a VSS reference 730. In the FIG. 8 embodiment, FE 322 further includes a current source 838 that may be implemented in any effective manner. For example, current source 838 may include, but is not limited to, an NMOS transistor or a PMOS transistor. In the FIG. 8 embodiment, current source 838 preferably exhibits a high input impedance and provides a relatively constant output current regardless of changes in the supply voltage VDD 726. In the FIG. 8 embodiment, current source 838 is connected between VDD 726 and FE core 740 to thereby isolate FE core 740 from unwanted disturbances in VDD 726.

In the FIG. 8 embodiment, FE 322 further includes a capacitor Ccore 844 that is connected across the power terminal and the reference terminal of FE core 740. In particular, capacitor Ccore 844 is connected on a first end to the connection between current source 838 and FE core 740, and on a second end to the connection between VSS 730 and FE core 740. In the FIG. 8 embodiment, capacitor Ccore 844 decouples FE core 740 from VSS 730 by providing high-frequency decoupling as a low-pass filter. The FIG. 8 embodiment also shows a Vcore bias voltage 848 across FE core 740.

In the FIG. 8 embodiment, changing the FE core bias 848 from VDD 726 to an internally regulated, VSS-referred node significantly improves the PSRR of FE 322. The FIG. 8 embodiment illustrates this improvement in which the FE core 740 is biased from a current source 838 with a decoupling capacitor Ccore 844 to VSS 730. Any disturbances on VDD 726 are thus attenuated by the potential divider action of the high impedance of current source 828 and the low impedance of FEcore 740, together with the low impedance of the Ccore decoupling capacitor 844 at high frequencies.

Another advantage to the FIG. 8 biasing technique is that the operating point, and hence the transconductance (Gm) of the unit Gm cells inside FE core 740, is less dependent on variations in VDD 726. Furthermore, the bias current may be made proportional to absolute temperature (PTAT), so that the unit Gm cells exhibit a constant Gm over temperature. Therefore, the proposed bias arrangement of FIG. 8 advantageously provides good power supply rejection and good stability over manufacturing process, power supply and temperature variations. Additional details for the implementation and utilization of front end 322 are further discussed below in conjunction with FIGS. 9-10.

Figure 9:
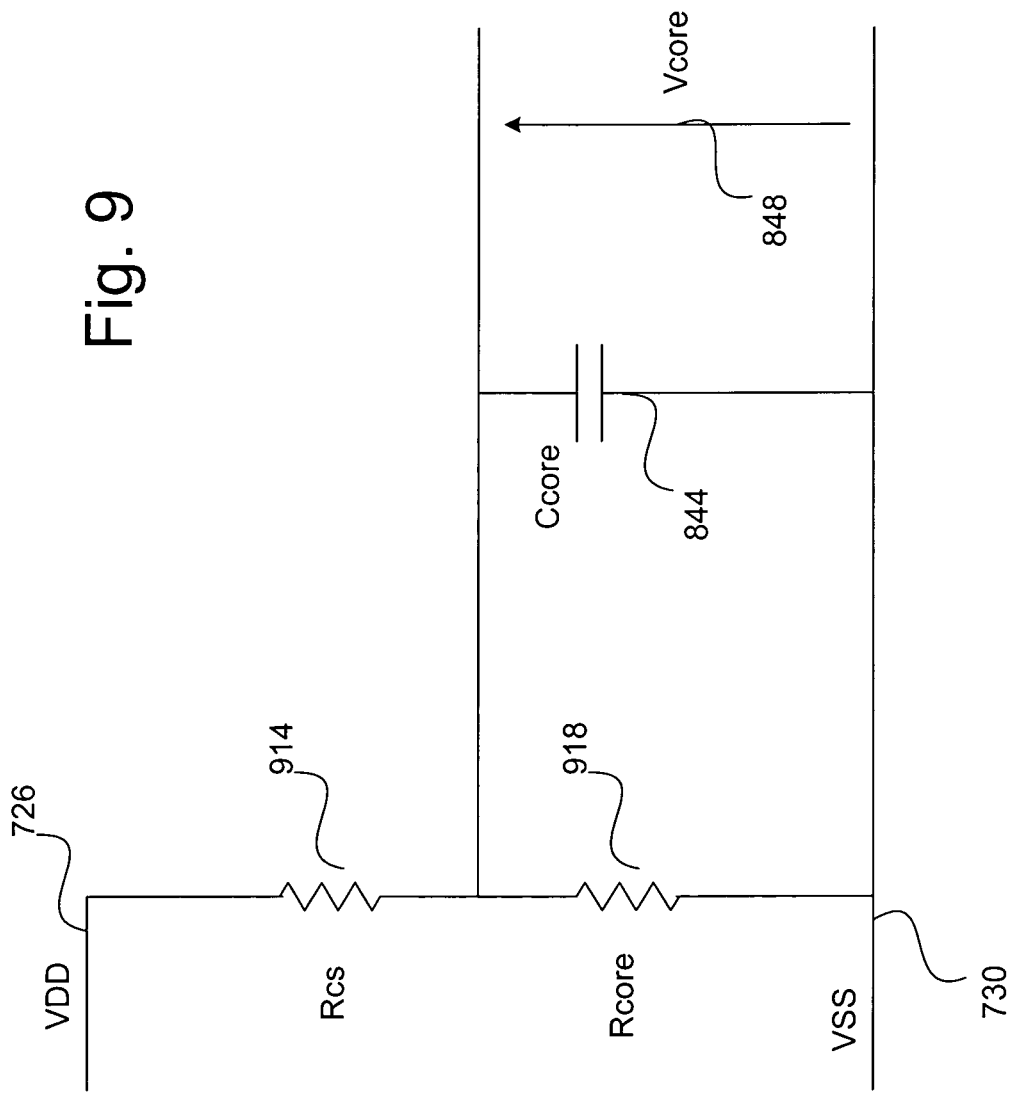
FIG. 9 is a simplified equivalent circuit corresponding to the front end of FIG. 8, in accordance with the present invention.

Referring now to FIG. 9, a simplified equivalent circuit corresponding to the FIG. 8 front end 322 is shown, in accordance with one embodiment of the present invention. The FIG. 9 diagram is presented for purposes of illustration, and in alternate embodiments, equivalent circuits may utilize components and configurations in addition to, or instead of, certain of those components and configurations discussed in conjunction with the FIG. 9 embodiment.

In the FIG. 9 embodiment, similarly numbered components are the same components disclosed and discussed above in conjunction with the FIG. 8 FE 322. In addition, the FIG. 9 circuit includes an Rcs impedance 914 and an Rcore impedance 918. In the FIG. 9 embodiment, Rcs impedance 914 represents the impedance across the FIG. 8 current source 838, and Rcore impedance 918 represents the impedance across the FIG. 8 FE core 740.

In the FIG. 9 embodiment, Rcs 914 may be selected to be substantially greater than Rcore 918. It will be appreciated by those skilled in the art that Rcs 914 and Rcore 918 form a voltage divider that reduces the value of VDD 716 to produce a bias voltage Vcore 848 for FE core 740. This reduction of VDD 726 also has the effect of reducing any unwanted disturbances or noise present on VDD 726 to thereby significantly increase the PSRR of FE 322 (FIG. 8). In practice, selecting a larger impedance for Rcs 914 with respect to Rcore 918 will produce greater power supply rejection characteristics for FE 322. In the FIG. 9 embodiment, Ccore 844 provides a low pass filtering function to decouple Vcore 848 (FIG. 8) from VSS 730.

Figure 10:
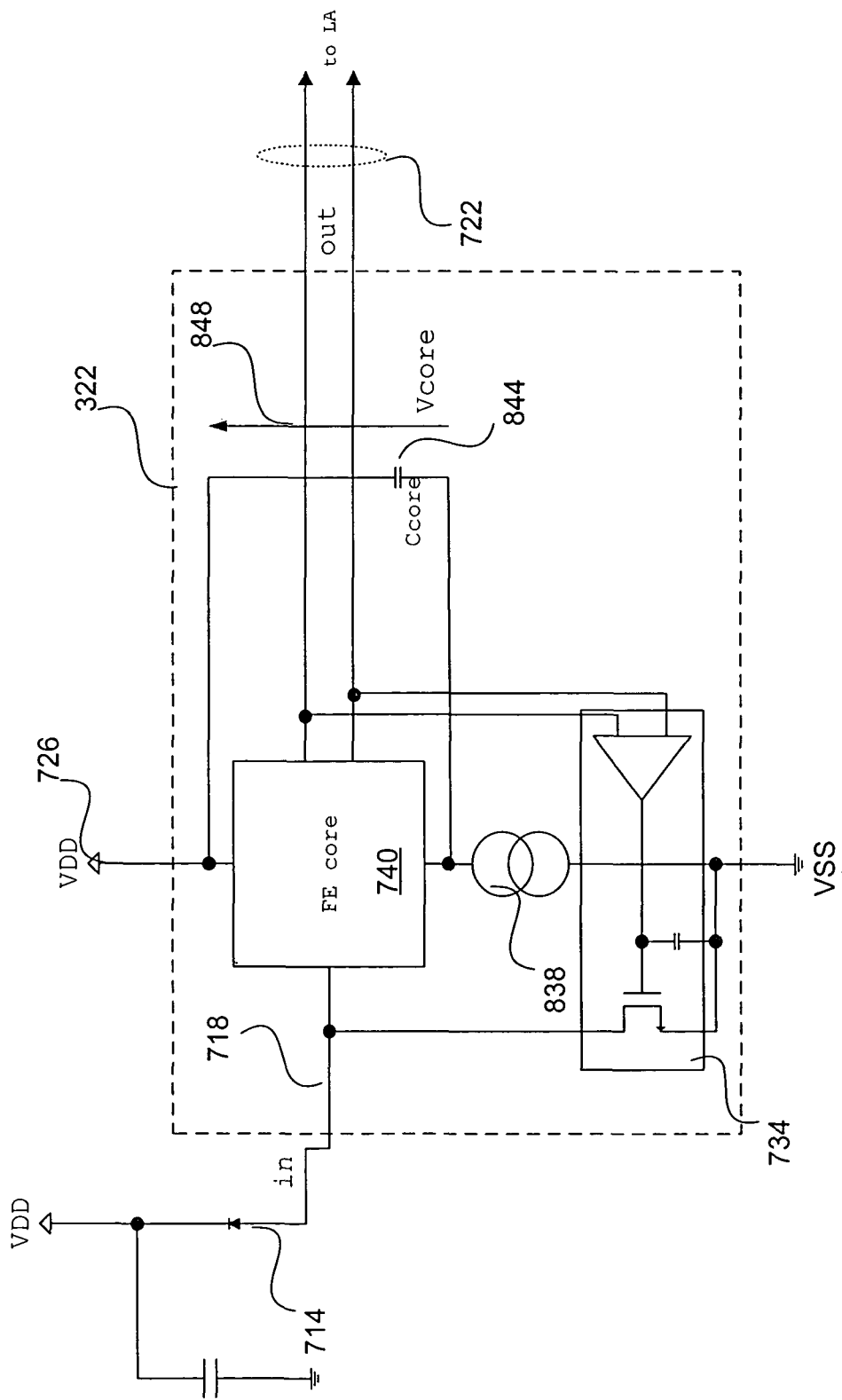
FIG. 10 is a schematic diagram for a second embodiment of a front end, in accordance with the present invention.

Referring now to FIG. 10, a schematic diagram for a second embodiment of a front end 322 is shown, in accordance with the present invention. The FIG. 10 diagram is presented for purposes of illustration, and in alternate embodiments, front ends 322 may utilize components and configurations in addition to, or instead of, certain of those components and configurations discussed in conjunction with the FIG. 10 embodiment.

The FIG. 10 embodiment may essentially be viewed as an inverted version of the foregoing FIG. 8 embodiment of FE 322. In particular, the FIG. 10 embodiment utilizes VSS 730 as a power source with reference to VDD 726. In the FIG. 10 embodiment, FE 322 includes a front end core (FE core) 740 that may be implemented in any effective manner including, but not limited to, the embodiments disclosed above in conjunction with FIGS. 4A, 4B, and 6. The FE core 740 receives an input signal 718 from a photo diode 714 and generates a balanced output signal 722. The FIG. 10 embodiment also includes a conventional DC cancellation circuit 734 that may be implemented in any effective manner. In the FIG. 10 embodiment, DC cancellation circuit 734 is connected from the output 722 to the input 718 of FE core 740 to attenuate the average DC component of input signal 718.

In the FIG. 10 embodiment, FE 322 includes a VSS power supply 730 that is referenced to a VDD reference 726. In the FIG. 10 embodiment, FE 322 further includes a current source 838 that may be implemented in any effective manner. For example, current source 838 may include, but is not limited to, a CMOS transistor or a PMOS transistor. In the FIG. 10 embodiment, current source 838 preferably exhibits a high input impedance and provides a relatively constant output current regardless of changes in the supply voltage VSS 730. In the FIG. 10 embodiment, current source 838 is connected between VSS 730 and FE core 740 to thereby isolate FE core 740 from unwanted disturbances in VSS 730.

In the FIG. 10 embodiment, FE 322 further includes a capacitor Ccore 844 that is connected across the power terminal and the reference terminal of FE core 740. In particular, capacitor Ccore 844 is connected on a first end to the connection between current source 838 and FE core 740, and on a second end to the connection between VDD 726 and FE core 740. In the FIG. 10 embodiment, capacitor Ccore 844 decouples FE core 740 from VDD 726 by providing high-frequency decoupling as a low-pass filter. The FIG. 10 embodiment, also shows a Vcore bias voltage 848 across FE core 740.

The FIG. 10 embodiment therefore provides an alternative configuration for FE 322 with the current source 838 in series with VSS 730 and the decoupling capacitor Ccore 844 connected to VDD 726. The FE core 740 is thus supplied from a VDD-referred, regulated VSS supply. For all of the foregoing reasons, the present invention provides an improved system and method for implemented a front end for a transimpedance amplifier.

The invention has been explained above with reference to certain embodiments. Other embodiments will be apparent to those skilled in the art in light of this disclosure. For example, the present invention may readily be implemented using configurations and techniques other than those described in the embodiments above. Additionally, the present invention may effectively be used in conjunction with systems other than those described above. Therefore, these and other variations upon the discussed embodiments are intended to be covered by the present invention, which is limited only by the appended claims.

What is claimed is:

1. An apparatus for implementing a front end circuit, comprising:
a front end core that receives an input signal and responsively generates a balanced output signal;
a power supply that provides a supply voltage to said front end circuit;
a capacitor device that is utilized to isolate said front end core; and
a current source that is implemented as a single electrical device that attenuates said supply voltage to produce a bias voltage that is provided to a power input of said front end core, said capacitor device being connected from said power input of said front end core to a reference voltage input of said front end core.

2. The apparatus of claim 1 wherein said front end core is utilized in a transimpedance amplifier of a receiver device.

3. The apparatus of claim 1 wherein said input signal is generated by a photo diode device.

4. The apparatus of claim 1 wherein said power supply is implemented as a VDD supply.

5. The apparatus of claim 4 wherein said current source is connected between said VDD supply and said front end core to isolate said front end core from disturbances on said VDD supply.

6. The apparatus of claim 1 wherein said current source exhibits a high impedance as compared to said front end core, said current source providing said bias voltage at a constant level without regard to variations and disturbances on said supply voltage.

7. The apparatus of claim 1 wherein said front end core is referenced to a VSS reference.

8. The apparatus of claim 7 wherein said VSS reference is connected directly to said front end core.

9. An apparatus for implementing a front end circuit, comprising:
a front end core that receives an input signal and responsively generates a balanced output signal, said front end core being referenced to a VSS reference that is connected directly to said front end core;
a power supply that provides a supply voltage to said front end circuit;
a current source that attenuates said supply voltage to produce a bias voltage for said front end core; and
a capacitor Ccore that acts as a low pass filter to decouple said front end core from said VSS reference, said capacitor Ccore being connected from a power input of said front end core to a reference voltage input of said front end core.

10. An apparatus for implementing a front end circuit, comprising:
a front end core that receives an input signal and responsively generates a balanced output signal;
a power supply that provides a supply voltage to said front end circuit
a capacitor device that is utilized to isolate said front end core, said capacitor device being connected from a power input of said front end core to a reference voltage input of said front end core; and
a current source that attenuates said supply voltage to produce a bias voltage for said front end core, a first impedance of said current source and a second impedance of said front end core forming a voltage divider to produce said bias voltage from said supply voltage.

11. The apparatus of claim 10 wherein said voltage divider improves a power supply rejection ratio of said front end circuit with respect to said power supply.

12. The apparatus of claim 1 wherein said power supply is implemented as a VSS supply.

13. The apparatus of claim 12 wherein said current source is connected between said VSS supply and said FE core to isolate said front end core from disturbances on said VSS supply.

14. The apparatus of claim 12 wherein said front end core is referenced to a VDD reference.

15. The apparatus of claim 14 wherein said VDD reference is connected directly to said front end core.

16. An apparatus for implementing a front end circuit, comprising:
a front end core that receives an input signal and responsively generates a balanced output signal, said front end core being referenced to a VDD reference that is connected directly to said front end core;
a power supply that provides a supply voltage to said front end circuit;
a current source that attenuates said supply voltage to produce a bias voltage for said front end core; and
a capacitor Ccore that acts as a low pass filter to decouple said front end core from said VDD reference, said capacitor Ccore being connected from a power input of said front end core to a reference voltage input of said front end core.

17. An apparatus for implementing a front end circuit, comprising:
a front end core that receives an input signal and responsively generates a balanced output signal;
a power supply that provides a supply voltage to said front end circuit; and
a current source that attenuates said supply voltage to produce a bias voltage for said front end core, said front end core including an input transimpedance stage that receives an FE core input signal and responsively generates an output transimpedance gain signal; a first output gain stage that receives said output transimpedance gain signal and responsively generates an FE core output signal; a phase inverter stage that receives said output transimpedance gain signal and responsively generates an inverted output signal; and a second output gain stage that receives said inverted output signal and responsively generates an inverted FE core output signal.

18. An apparatus for implementing a front end circuit, comprising:
a front end core that receives an input signal and responsively generates a balanced output signal;
a power supply that provides a supply voltage to said front end circuit; and
a current source that attenuates said supply voltage to produce a bias voltage for said front end core, said front end core being implemented with multiples of a unit Gm cell that includes an input P that receives an input P signal and an input N that receives an input N signal, said unit Gm cell further including an output P that generates an output P signal that is connected through a first bias resistor to said input N, said unit Gm cell also including an output N that generates an output N signal that is connected through a second bias resistor to said input P.

19. The apparatus of claim 18 wherein said unit Gm cell includes level-shifting resistors that cause said output P signal and said output N signal to be at different respective voltage levels, a Vcore supply voltage being reduced by a voltage potential across said level-shifting resistors to operate said unit Gm cell with a reduced Vcore supply voltage.

20. A method for implementing a front end circuit by performing the steps of:
- providing a front end core that receives an input signal and responsively generates a balanced output signal;
- generating a supply voltage from a power supply to said front end circuit;
- isolating said front end core with a capacitor device; and
- utilizing a current source implemented as a single electrical device for attenuating said supply voltage to produce a bias voltage that is provided to a power input of said front end core, said capacitor device being connected from said power input of said front end core to a reference voltage input of said front end core.

* * * * *